United States Patent
Lee et al.

(10) Patent No.: US 8,766,265 B2
(45) Date of Patent: Jul. 1, 2014

(54) ORGANIC LIGHT-EMITTING DISPLAY DEVICE AND METHOD OF MANUFACTURING THE SAME

(75) Inventors: June-Woo Lee, Yongin (KR); Jae-Beom Choi, Yongin (KR); Kwan-Wook Jung, Yongin (KR); Seong-Hyun Jin, Yongin (KR); Kwang-Hae Kim, Yongin (KR); Ga-Young Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 36 days.

(21) Appl. No.: 13/469,933

(22) Filed: May 11, 2012

(65) Prior Publication Data
US 2013/0119388 A1  May 16, 2013

(30) Foreign Application Priority Data
Nov. 10, 2011 (KR) .......................... 10-2011-0117167

(51) Int. Cl.
*H01L 51/50* (2006.01)
(52) U.S. Cl.
USPC ............... 257/59; 257/E51.018; 257/E33.053
(58) Field of Classification Search
USPC ............................ 257/59, E51.018, E33.053
See application file for complete search history.

(56) References Cited

U.S. PATENT DOCUMENTS

| 7,256,534 B2 * | 8/2007 | Koo et al. ...................... 313/306 |
| 2009/0278131 A1 * | 11/2009 | Kwon et al. ..................... 257/72 |
| 2010/0193790 A1 | 8/2010 | Yeo et al. |

FOREIGN PATENT DOCUMENTS

| KR | 10-2000-0039802 | 7/2000 |
| KR | 10-2009-0116131 | 11/2009 |
| KR | 10-2010-0088269 | 8/2010 |

* cited by examiner

*Primary Examiner* — Zandra Smith
*Assistant Examiner* — Paul Patton
(74) *Attorney, Agent, or Firm* — Knobbe Martens Olson & Bear LLP

(57) ABSTRACT

An OLED device includes: a TFT including an active layer, gate, source and drain electrodes, a first insulating layer between the active layer and the gate electrode, and a second insulating layer between the source and drain electrodes, a pixel electrode on the first and second insulating layers, connected to one of the source and drain electrodes, a capacitor including a first electrode on the same layer as the active layer, a second electrode on the same layer as the gate electrode, and a third electrode formed of the same material as the pixel electrode, a third insulating layer between the second insulating layer and the pixel electrode and between the second and third electrodes, a fourth insulating layer covering the source, drain and third electrodes, exposing a portion of the pixel electrode, an organic light-emitting layer on the pixel electrode, and a counter electrode on the organic light-emitting layer.

21 Claims, 3 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the benefit of Korean Patent Application No. 10-2011-0117167, filed on Nov. 10, 2011, in the Korean Intellectual Property Office, the disclosure of which is incorporated herein in its entirety by reference.

BACKGROUND

1. Field

The present disclosure relates to an organic light-emitting display device and a method of manufacturing the same.

2. Description of the Related Technology

Flat panel display devices such as organic light-emitting display devices or liquid crystal display (LCD) devices generally include a thin film transistor (TFT), a capacitor, and wiring for connecting the TFT and the capacitor.

The TFT, capacitor, and wiring are finely patterned on a substrate of a flat panel display device. In order to form such a fine pattern on the substrate, photolithography is often used to transfer a pattern by using a mask.

Photolithography involves uniformly applying a photoresist to a substrate on which a pattern is to be formed, exposing the photoresist by using an exposure device such as a stepper, developing the photoresist if the photoresist is a positive photoresist, etching the pattern formed on the substrate by using a remaining part of the photoresist, and removing an unnecessary remaining part of the photoresist after the pattern is formed.

Since a mask including a desired pattern needs to be first prepared when photolithography is used, costs for preparing the mask add up to costs for manufacturing a flat panel display device. Since the above-described complicated steps have to be performed, the manufacturing process of the flat panel display device becomes complex and the manufacturing time increases, and thus, general manufacturing costs of the flat panel display device increase.

SUMMARY OF CERTAIN INVENTIVE ASPECTS

Embodiments of the present invention provide an organic light-emitting display device that is manufactured by using a simple manufacturing process and has high electrostatic capacitance and high light-use efficiency, and a method of manufacturing the organic light-emitting display device.

According to one aspect, there is provided an organic light-emitting display device including: a thin film transistor (TFT) that includes an active layer, a gate electrode, a source electrode, a drain electrode, a first insulating layer disposed between the active layer and the gate electrode, and a second insulating layer disposed between the source electrode and the drain electrode; a pixel electrode disposed on the first insulating layer and the second insulating layer, and connected to one of the source electrode and the drain electrode; a capacitor that includes a first electrode disposed on a same layer as the active layer, a second electrode disposed on the same layer as the gate electrode, and a third electrode formed of the same material as a material of the pixel electrode; a third insulating layer disposed between the second insulating layer and the pixel electrode and further disposed between the second electrode and the third electrode; a fourth insulating layer covering the source electrode, the drain electrode, and the third electrode, and exposing a portion of the pixel electrode; an organic light-emitting layer disposed on the pixel electrode; and a counter electrode disposed on the organic light-emitting layer.

The second insulating layer can not be disposed between the second electrode and the third electrode.

The third insulating layer can have a thickness less than a thickness of the second insulating layer.

The thickness of the third insulating layer can be from about 500 Å to about 2000 Å.

The third insulating layer can include at least one selected from the group consisting of $SiN_x$, $SiO_2$, $ZrO_2$, $TiO2$, $Ta_2O_5$, and $Al_2O_3$.

The first insulating layer, the second insulating layer, and the third insulating layer can be sequentially disposed between the substrate and the pixel electrode, and refractive indices of adjacent insulating layers of the first through third insulating layers can be different from each other.

Each of the active layer and the first electrode can include a semiconductor doped with ion impurities.

The gate electrode can include a first layer that includes a transparent conductive oxide and a second layer that includes a low-resistance metal, and the second electrode can include the transparent conductive oxide.

The pixel electrode can include a transparent conductive oxide.

The transparent conductive oxide can include at least one selected from the group consisting of indium zinc oxide (IZO), zinc oxide (ZnO), indium oxide ($In_2O_3$), indium gallium oxide (IGO), and aluminum zinc oxide (AZO).

The pixel electrode can further include a semi-transmissive metal layer.

The semi-transmissive metal layer can be disposed on a layer including the transparent conductive oxide.

The semi-transmissive metal layer can include at least one selected from the group consisting of silver (Ag), aluminum (Al), and an alloy thereof.

The organic light-emitting display device can further include a protective layer that is disposed on the semi-transmissive metal layer.

The protective layer can include a transparent conductive oxide.

The pixel electrode and the third insulating layer can have a same etched surface.

The third electrode and the third insulating layer can have a same etched surface.

One of the source electrode and the drain electrode connected to the pixel electrode can be disposed over a portion of the pixel electrode.

The organic light-emitting display device can further include a pad electrode formed of a same material as that of each of the source electrode and the drain electrode.

The pad electrode can be disposed on a same layer as each of the source electrode and the drain electrode.

The counter electrode can be a reflective electrode that reflects light emitted by the organic light-emitting layer.

According to another aspect, there is provided a method of manufacturing an organic light-emitting display device, the method including: forming a semiconductor layer on a substrate, and forming an active layer of a TFT and a first electrode of a capacitor by patterning the semiconductor layer; forming a first insulating layer, forming a first conductive layer on the first insulating layer, and forming a gate electrode of the TFT and a second electrode of the capacitor by patterning the first conductive layer; forming a second insulating layer, and forming an opening I the second insulating layer to expose portions of a source region and a drain region of the active layer and the second electrode; sequentially forming a third insulating layer and a second conductive layer, and forming a pixel electrode and a third electrode by simultaneously patterning the third insulating layer and the second conductive layer; forming a third conductive layer, and forming a source electrode and a drain electrode by patterning the third conductive layer; and forming a fourth insulating layer, removing a portion of the fourth insulating layer to expose a portion of the pixel electrode.

The method can include sequentially stacking a first layer that includes a transparent conductive oxide and a second layer that includes a low-resistance metal.

The method can further include doping the source region and the drain region with ion impurities.

The method can include forming the second conductive layer as a transparent conductive oxide layer.

The method can include forming the second conductive layer by sequentially stacking a transparent conductive oxide layer and a semi-transmissive conductive layer.

The method can further include forming a protective layer on the semi-transmissive conductive layer.

The method can include forming a pad electrode that includes the same material as a material of each of the source electrode and the drain electrode.

The method can further include forming an organic light-emitting layer and a counter electrode on the pixel electrode.

BRIEF DESCRIPTION OF THE DRAWINGS

The above and other features and advantages n will become more apparent by describing in detail certain embodiments with reference to the attached drawings in which.

DETAILED DESCRIPTION OF CERTAIN INVENTIVE EMBODIMENTS

As used herein, the term "and/or" includes any and all combinations of one or more of the associated listed items. Expressions such as "at least one of," when preceding a list of elements, modify the entire list of elements and do not modify the individual elements of the list.

The present invention will now be described more fully with reference to the accompanying drawings, in which certain embodiments of the invention are shown.

Figure 1:
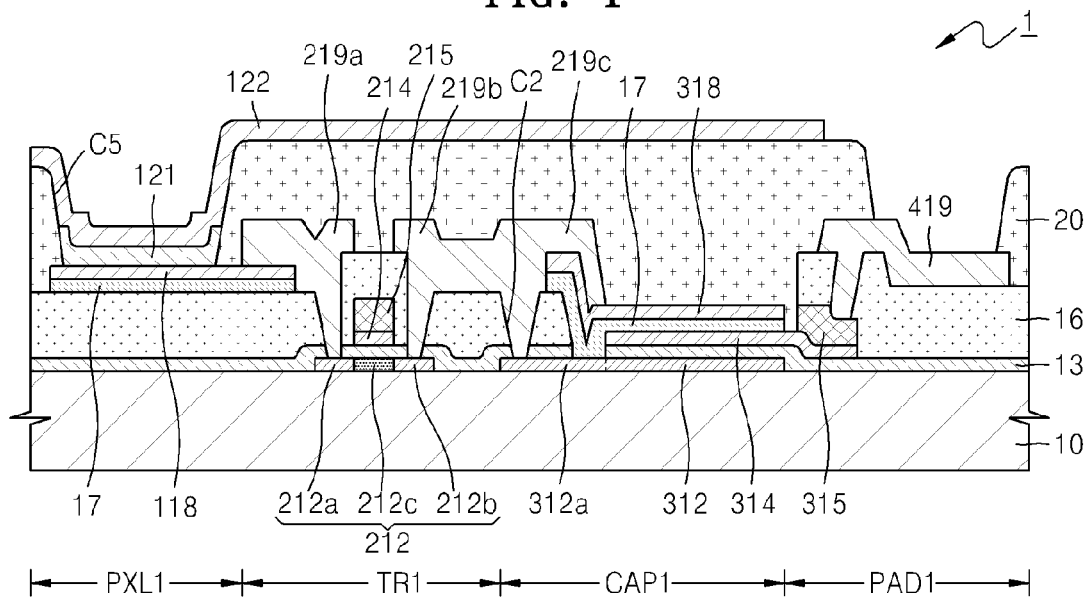
FIG. 1 is a cross-sectional view illustrating an embodiment of an organic light-emitting display device.

FIG. 1 is a cross-sectional view illustrating an embodiment of an organic light-emitting display device 1.

Referring to FIG. 1, a substrate 10 of the organic light-emitting display device 1 includes a pixel region PXL1, a transistor region TR1, a capacitor region CAP1, and a pad region PAD1.

In the transistor region TR1, an active layer 212 of a thin film transistor (TFT) is disposed on the substrate 10.

The substrate 10 can be a transparent substrate such as a glass substrate or a plastic substrate including polyethylene terephthalate (PET), polyethylene naphthalate (PEN), or polyimide.

The active layer 212 is disposed on the substrate 10. The active layer 212 can be formed of a semiconductor including amorphous silicon or crystalline silicon. The active layer 212 can include a source region 212a and a drain region 212b that are disposed outside a channel region 212c and are doped with ion impurities.

Although not shown in FIG. 1, a buffer layer (not shown) for planarizing the substrate 10 and preventing impurity elements from penetrating into the substrate 10 can be further disposed between the substrate 10 and the active layer 212. The buffer layer can have a single-layer structure or a multi-layer structure formed of silicon nitride and/or silicon oxide.

A gate electrode, including a first layer 214 and a second layer 215, is disposed over the active layer 212 at a position corresponding to the channel region 212c of the active layer 212 with a first insulating layer 13, which is a gate insulating film, disposed between the active layer 212 and the gate electrode. The first layer 214 of the gate electrode includes a transparent conductive oxide and the second layer 215 of the gate electrode includes a low-resistance metal. The first layer 214 can include at least one of indium tin oxide (ITO), indium zinc oxide (IZO), zinc oxide (ZnO), indium oxide ($In_2O_3$), indium gallium oxide (IGO), and aluminum zinc oxide (AZO). The second layer 215 can have a single-layer structure or a multi-layer structure formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

A source electrode 219a and a drain electrode 219b are disposed over portions of the first layer 214 and the second layer 215 of the gate electrode with a second insulating layer 16, which is an interlayer insulating film, disposed between the gate electrode and the source electrode 219a and the drain electrode 219b and are connected to the source region 212a and the drain region 212b of the active layer 212, respectively. Each of the source electrode 219a and the drain electrode 219b can be formed to have a single-layer structure or a multi-layer structure formed of at least one metal selected from the group consisting of Al, Pt, Pd, Ag, Mg, Au, Ni, Nd, Ir, Cr, Li, Ca, Mo, Ti, W, and Cu.

A fourth insulating layer 20 is disposed on the second insulating layer 16 to cover the source electrode 219a and the drain electrode 219b.

The first insulating layer 13 is used as a gate insulating film and the second insulating layer 16 is used as an interlayer insulating film, in the transistor region TR1. Each of the first insulating layer 13 and the second insulating layer 16 can be an inorganic insulating film. Examples of the inorganic insulating film for forming each of the first insulating layer 13 and the second insulating layer 16 can include $SiO_2$, SiNx, SiON, $Al_2O_3$, $TiO_2$, $Ta_2O_5$, $HfO_2$, $ZrO_2$, barium strontium titanate (BST), and lead zirconium titanate (PZT).

In the pixel region PXL1, a pixel electrode 118 formed of the same material as a material of a third electrode 318 of a capacitor (described below) is disposed over the second insulating layer 16. A third insulating layer 17 is disposed between the pixel electrode 118 and the second insulating layer 16. The first insulating layer 13, the second insulating layer 16, and the third insulating layer 17 are sequentially disposed between the pixel electrode 118 and the substrate 10.

The insulating layers disposed between the substrate 10 and the pixel electrode 118 can be formed such that refractive indices of adjacent layers of the first through third insulating layers 13, 16, and 17 are different from each other. Insulating layers having different refractive indices are alternately disposed to function as a distributed Brag reflector (DBR). Therefore, the use efficiency of light emitted by an organic light-emitting layer 121 can be improved. Although the first insulating layer 13, the second insulating layer 16, and the third insulating layer 17 are formed as individual single layers in the embodiment of FIG. 1, in other embodiments, the first through third insulating layers 13, 16, and 17 can be formed to have multi-layer structures.

The pixel electrode 118 is directly disposed on the third insulating layer 17. As described below, since the third insulating layer 17 and the pixel electrode 118 are patterned by using the same mask in the same mask process, the third insulating layer 17 and the pixel electrode 118 have the same etched surface.

Since the pixel electrode 118 is formed of a transparent conductive material, light emitted by the organic light-emitting layer 121 can travel toward the pixel electrode 118. The transparent conductive material can include at least one of ITO, IZO, ZnO, $In_2O_3$, IGO, and AZO.

The organic light-emitting layer 121 is formed on the pixel electrode 118, and light emitted by the organic light-emitting layer 121 is emitted toward the substrate 10 through the pixel electrode 118 formed of a transparent conductive material.

The fourth insulating layer 20 is formed around portions of the pixel electrode 118. An opening C5 through which a portion of the pixel electrode 118 is exposed is formed in the fourth insulating layer 20. The organic light-emitting layer 121 is disposed in the opening C5.

The organic light-emitting layer 121 can be formed of a low molecular weight organic material or a high molecular weight organic material. If the organic light-emitting layer 121 is formed of a low molecular weight organic material, a hole transport layer (HTL), a hole injection layer (HIL), an electron transport layer (ETL), and an electron injection layer (EIL) can be stacked around the organic light-emitting layer 121. If necessary, other various layers can be stacked. Examples of the low molecular weight organic material include copper phthalocyanine (CuPc), N'-Di(naphthalene-1-yl)-N,N'-diphenyl-benzidine (NPB), and tris-8-hydroxyquinoline aluminum (Alq3). If the organic light-emitting layer 121 is formed of a high molecular weight organic material, an HTL can be provided in addition to the organic light-emitting layer 121. The HTL can be formed of poly-(3,4)-ethylene-dihydroxy thiophene (PEDOT), or polyaniline (PANT). In this case, examples of the high molecular weight organic material include a polyphenylene vinylene (PPV)-based high molecular weight organic material and a polyfluorene-based high molecular weight organic material. Also, an inorganic material can be further disposed between the organic light-emitting layer 121 and the pixel electrode 118 and a counter electrode 122.

The counter electrode 122 is disposed on the organic light-emitting layer 121 as a common electrode. In the organic light-emitting display device 1 of FIG. 1, the pixel electrode 118 operates as an anode and the counter electrode 122 operates as a cathode. In other embodiments, the pixel electrode 118 can operate as a cathode and the counter electrode 122 can operate as an anode.

The counter electrode 122 can be a reflective electrode including a reflective material. In some embodiments, the counter electrode 122 can include one of Al, Mg, Li, Ca, LiF/Ca, and LiF/Al. Since the counter electrode 122 is a reflective electrode, light emitted by the organic light-emitting layer 121 is reflected by the counter electrode 122 and is transmitted through the pixel electrode 118 formed of a transparent conductive material toward the substrate 10.

The fourth insulating layer 20 covering around portions of the pixel electrode 118 functions as a pixel-defining film between the pixel electrode 118 and the counter electrode 122.

The fourth insulating layer 20 can be an organic insulating film. The fourth insulating layer 20 can include a commercial polymer such as polymethyl methacrylate (PMMA) or polystyrene (PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, or a blend thereof.

The fourth insulating layer 20 covers the source electrode 219a and the drain electrode 219b of the TFT, and one of the source electrode 219a and the drain electrode 219b is electrically connected to the pixel electrode 118. The source electrode 219a is connected to the pixel electrode 118 in FIG. 1. In other embodiments, the pixel electrode 118 can be electrically connected to the drain electrode 219b. In such embodiments, one of the source electrode 219a and the drain electrode 219b connected to the pixel electrode 118 is disposed over the pixel electrode 118. As described below, this is because the source electrode 219a and the drain electrode 219b are patterned later than the pixel electrode 118. Accordingly, each of the source electrode 219a and the drain electrode 219b is formed of a material having an etching rate different from that of the pixel electrode 118.

In the capacitor region CAP1, a first electrode 312 formed on the same layer as the active layer 212, a second electrode 314 formed on the same layer as the first layer 214 of the gate electrode, and a third electrode 318 formed of the same material as the pixel electrode 118 are formed on the substrate 10.

The first electrode 312 is formed of the same material on the same layer as the active layer 212. The first electrode 312 includes a semiconductor doped with ion impurities, like the source region 212a and the drain region 212b of the active layer 212. Accordingly, since the first electrode 312 uses a semiconductor doped with ion impurities, an electrostatic capacitance can be higher than that when an intrinsic semiconductor is used.

The second electrode 314 is formed of the same material on the same layer as the first layer 214 of the gate electrode. The second electrode 314 can include a transparent conductive oxide. Since the second electrode 314 is formed of a transparent conductive oxide, the first electrode 312 can be doped with ion impurities through the second electrode 314.

The third electrode 318 is formed of the same material as that of the pixel electrode 118. Also, since the third electrode 318 and the third insulating layer 17 are patterned in the same mask process, the third electrode 318 and the third insulating layer 17 can have the same etched surface.

The first insulating layer 13 is disposed between the first electrode 312 and the second electrode 314 and functions as a first dielectric film of the capacitor. The third insulating layer 17 is disposed between the second electrode 314 and the third electrode 318 and functions as a second dielectric film of the capacitor. However, since the second insulating layer 16 is not disposed between the first through third electrodes 312, 314, and 318, the second insulating layer 16 does not function as a dielectric film.

The second insulating layer 16, which functions as an interlayer insulating film of the TFT, is designed to have a thickness equal to, or greater than, a predetermined thickness in consideration of characteristics of the TFT. However, since an electrostatic capacitance of the capacitor decreases as a thickness of a dielectric film increases, if the dielectric film has the same thickness as that of the interlayer insulating film, the electrostatic capacitance can decrease.

However, the second insulating layer 16 of FIG. 1 is not used as a dielectric film of the capacitor. Since the third insulating layer 17 used as a second dielectric film in FIG. 1 can be thinner than the second insulating layer 16, an electrostatic capacitance of the capacitor can be prevented from decreasing. In this case, an appropriate electrostatic capacitance can be maintained when a thickness of the third insulating layer 17 is equal to or greater than about 500 Å and equal to or less than about 2000 Å.

Also, the third insulating layer 17 used as a second dielectric film can be formed of an insulating material having a high dielectric constant. Since the third insulating layer 17 is not formed in the transistor region TR1, the third insulating layer 17 is separately formed from the first insulating layer 13 that is a gate insulating film and the second insulating layer 16 that is an interlayer insulating film. Accordingly, an electrostatic capacitance of the capacitor can increase when the third insulating layer 17 is formed of a material having a high dielectric constant. For example, the third insulating layer 17 can include at least one of $SiO_2$, $SiNx$, $SiON$, $Al_2O_3$, $TiO_2$, $Ta_2O_5$, $HfO_2$, $ZrO_2$, BST, and PZT.

The first electrode 312 and the third electrode 318 are electrically connected to each other by a source/drain wiring 219c through an opening C2 formed in the second insulating layer 16. Accordingly, since a first electrostatic capacitance of the first electrode 312 and the second electrode 314 and a second electrostatic capacitance of the second electrode 314 and the third electrode 318 are in parallel, a total electrostatic capacitance is increased. Since an electrostatic capacitance is increased without increasing an area of the capacitor, an area of the pixel electrode 118 can be increased, thereby increasing an aperture ratio of the organic light-emitting display device 1.

The fourth insulating layer 20 is disposed on the third electrode 318. The fourth insulating layer 20 can be an organic insulating film. Since the fourth insulating layer 20, including an organic insulating material having a low dielectric constant, is disposed between the counter electrode 122 and the third electrode 318, a parasitic capacitance, which can be formed between the counter electrode 122 and the third electrode 318, can be reduced, thereby preventing signal interference due to the parasitic capacitance.

The pad region PAD1 in which a pad electrode 419, which is a connection terminal of an external drive, is disposed is an outer region of the organic light-emitting display device 1.

In FIG. 1, the pad electrode 419 can be formed of the same material as that of each of the source electrode 219a and the drain electrode 219b. Also, the pad electrode 419 is disposed on the same layer as each of the source electrode 219a and the drain electrode 219b. The pad electrode 419 is directly disposed on the second insulating layer 16.

The pad electrode 419 is formed later than the gate electrode including the first layer 214 and the second layer 215, the pixel electrode 118, and the third electrode 318. Accordingly, a material for forming the gate electrode including the first layer 214 and the second layer 215, the pixel electrode 118, or the third electrode 318 is not located over the pad electrode 419. The reliability of the pad electrode 419 is prevented from being reduced by a process of locating a material for forming the gate electrode including the first layer 214 and the second layer 215, the pixel electrode 148, or the third electrode 318 on the pad electrode 419 or removing the material from the pad electrode 419.

Although not shown in FIG. 1, the organic light-emitting display device 1 can further include an encapsulation member (not shown) for encapsulating a display region including the pixel region PXL1, the capacitor region CAP1, and the transistor region TR1. The encapsulation member can be formed as a substrate including a glass material, a metal film, or an encapsulation thin film by alternately disposing an organic insulating film and an inorganic insulating film.

An embodiment of a method of manufacturing the organic light-emitting display device 1 of FIG. 1 will now be explained with reference to FIGS. 2A through 2F.

Figure 2A:
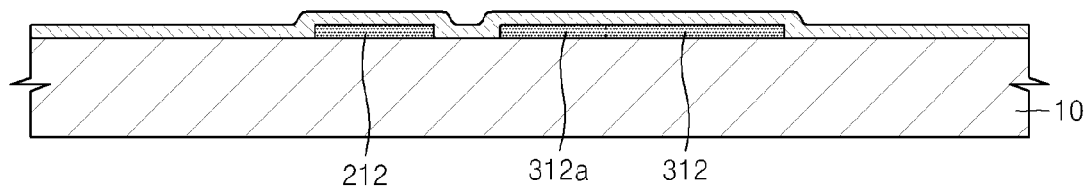
FIGS. 2A through 2F are cross-sectional views illustrating an embodiment of a method of manufacturing the organic light-emitting display device of FIG. 1.

FIG. 2A is a cross-sectional view illustrating a first mask process of an embodiment of the method of manufacturing the organic light-emitting display device 1.

Referring to FIG. 2A, a semiconductor layer (not shown) is formed on the substrate 10, and the active layer 212 of the TFT and the first electrode 312 of the capacitor are formed by patterning the semiconductor layer. When the first electrode 312 is formed, a wiring portion 312a for transmitting a signal to the first electrode 312 can also be formed.

Although not shown in FIG. 2A, the semiconductor layer is deposited on the substrate 10, a photoresist (not shown) is applied to the semiconductor layer, and the semiconductor layer is patterned by using photolithography using a first photomask (not shown). As a result, the active layer 212, the first electrode 312, and the wiring portion 312a are formed. The first mask process using photolithography is performed by exposing the first photomask to light by using an exposure device (not shown) and performing a series of operations such as developing, etching, and stripping or ashing.

The semiconductor layer can include amorphous silicon or crystalline silicon such as polysilicon. The crystalline silicon can be formed by crystallizing the amorphous silicon. Examples of a method of crystallizing the amorphous silicon include rapid thermal annealing (RTA), solid phase crystallization (SPC), excimer laser annealing (ELA), metal-induced crystallization (MIC), metal-induced lateral crystallization (MILC), and sequential lateral solidification (SLS).

Figure 2B:
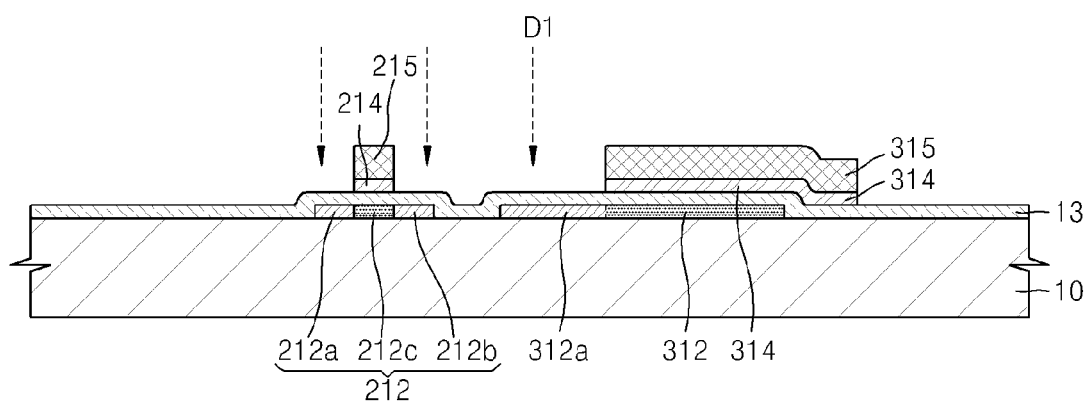

FIG. 2B is a cross-sectional view illustrating a second mask process of the method of manufacturing the organic light-emitting display device 1.

Referring to FIG. 2B, the first insulating layer 13 is stacked on a resultant structure of the first mask process of FIG. 2A, a first conductive layer (not shown) is stacked on the first insulating layer 13, and patterning is performed. The first conductive layer (not shown) can include a first layer including a transparent conductive oxide and a second layer including a low-resistance metal. The second layer including the low-resistance metal can have a single-layer structure or a multi-layer structure formed of at least one metal selected from Al, Pt, Pd, Ag, Mg, Au, Ni, Nd, Ir, Cr, Li, Ca, Mo, Ti, W, and Cu.

As a result of the patterning, the gate electrode including the first layer 214 and the second layer 215 and a layer unit including the second electrode 314 and an upper layer 315 are formed on the first insulating layer 13. The first insulating layer 13 functions as a gate insulating film of the TFT and a first dielectric film of the capacitor.

A resultant structure is doped with ion impurities D1. The ion impurities D1 can be B ion impurities or P ion impurities, and the resultant structure can be doped at about $1 \times 10^{15}$ atoms/cm$^2$ or more by using the active layer 212, the first electrode 312, and the wiring portion 312a as targets. The layer unit, including the second electrode 314 and the upper layer 315, and the gate electrode, including the first layer 214 and the second layer 215, function as self-aligned masks. As a result, the source region 212a and the drain region 212b outside the channel region 212c of the active layer 212, and the wiring portion 312a are doped with the ion impurities D1.

Figure 2C:
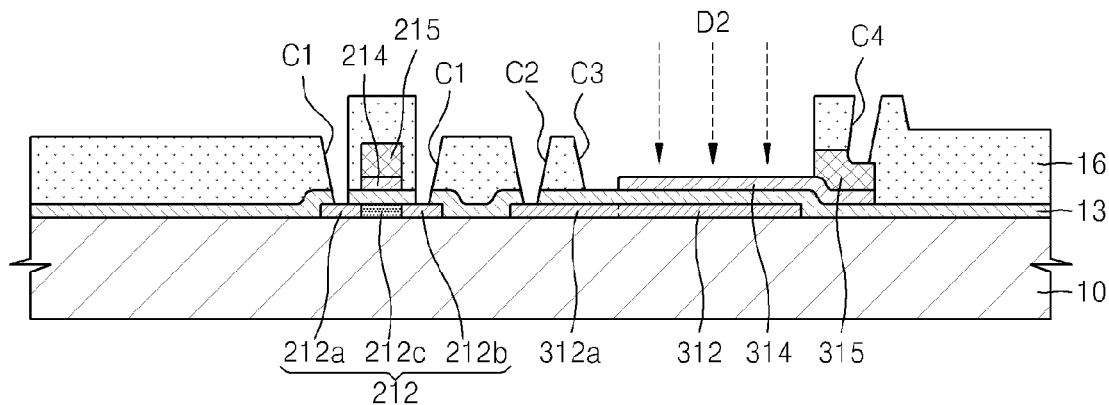

FIG. 2C is a cross-sectional view illustrating a third mask process of the method of manufacturing the organic light-emitting display device 1.

Referring to FIG. 2C, the second insulating layer 16 is stacked on a resultant structure of the second mask process of FIG. 2B, and an opening C1 through which the source region 212a and the drain region 212b of the active layer 212 are partially exposed, an opening C2 through which the wiring portion 312a connected to the first electrode 312 is partially exposed, an opening C3 through which the layer unit, including the second electrode 314 and the upper layer 315, is exposed, and an opening C4 through which the upper layer 315 is partially exposed are formed by patterning the second insulating layer 16.

Although not shown in FIG. 2C, after the opening C3 through which the second electrode 314 and the upper layer 315 are exposed is formed, a portion of the upper layer 315 is removed, thereby completing a resultant structure of the third mask process of FIG. 2C. For example, after the openings C1 through C4 are formed in the second insulating layer 16 by using dry etching, a portion of the upper layer 315 can be removed by using wet etching. The upper layer 315 covered by the opening C3 has a remaining pattern as shown in FIG. 2C. The upper layer 315 can be connected to the pad electrode 419 through the opening C4.

The second insulating layer 16 can be an inorganic insulating film formed of one of $SiO_2$, SiNx, SiON, $Al_2O_3$, $TiO_2$, $Ta_2O_5$, $HfO_2$, $ZrO_2$, BST, and PZT. In some embodiments, the second insulating layer 16 is formed of a material having a refractive index different from that of the first insulating layer 13.

A resultant structure is doped with ion impurities D2. Since an exposed portion of the upper layer 315 is removed, the first electrode 312 is doped with the ion impurities D2. Accordingly, since there is no region between the first electrode 312 and the wiring portion 312a doped with the impurities D2, the signal transmission efficiency of the capacitor can be improved.

Figure 2D:
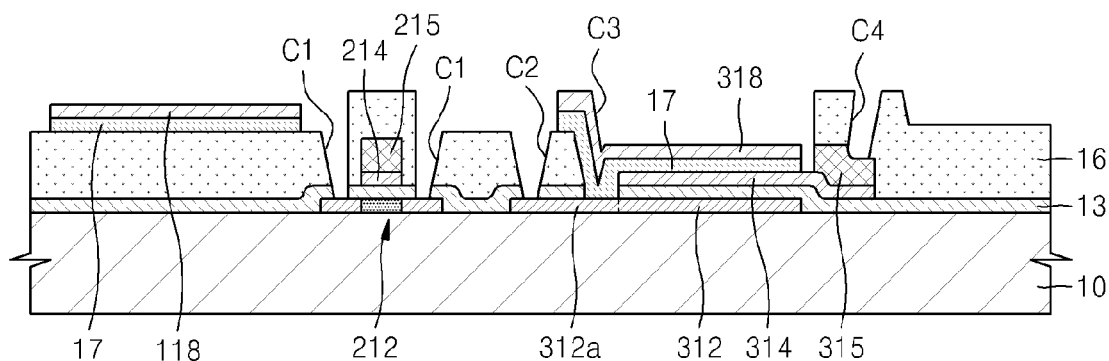

FIG. 2D is a cross-sectional view illustrating a fourth mask process of the method of manufacturing the organic light-emitting display device 1.

Referring to FIG. 2D, after the third insulating layer 17 and a second conductive layer (not shown) are sequentially formed on a resultant structure of the third mask process of FIG. 2C, the third insulating layer 17 and the second conductive layer are simultaneously patterned. As a result of the patterning, the pixel electrode 118 and the third electrode 318 are formed, and the pixel electrode 118 and the third electrode 318 have the same etched surface as that of the third insulating layer 17 that is disposed under the pixel electrode 118 and the third electrode 318.

The third insulating layer 17 can be an inorganic insulating film formed of one of $SiO_2$, SiNx, SiON, $Al_2O_3$, $TiO_2$, $Ta_2O_5$, $HfO_2$, $ZrO_2$, BST, and PZT. In some embodiments, in order to function as a DBR, the third insulating layer 17 is formed of a material having a refractive index different from that of each of the first insulating layer 13 and the second insulating layer 16.

The second insulating layer 16 can be formed of a transparent conductive oxide. For example, the second conductive layer 16 can be formed of a material selected from ITO, IZO, ZnO, $In_2O_3$, IGO, and AZO.

Although the third insulating layer 17 and the second conductive layer 16 are patterned in the same mask process, etching can be performed two times. That is, a step of etching the third insulating layer 17 and a step of etching the second conductive layer 16 can be separately performed.

Figure 2E:
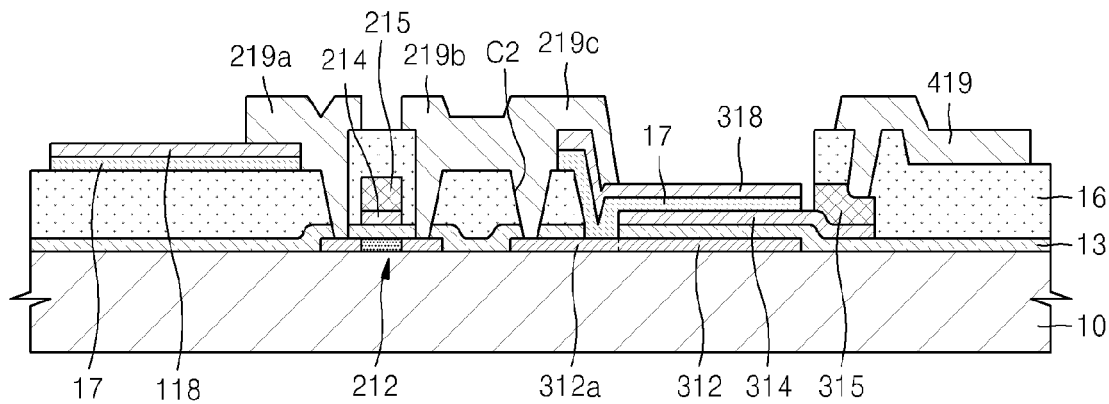

FIG. 2E is a cross-sectional view illustrating a fifth mask process of the method of manufacturing the organic light-emitting display device 1.

Referring to FIG. 2E, after a third conductive layer (not shown) is formed on a resultant structure of the fourth mask process of FIG. 2D, the source electrode 219a, the drain electrode 219b, the source/drain wiring 219c, and the pad electrode 419 are formed.

The source electrode 219a and the drain electrode 219b are electrically connected to the source region 212a and the drain region 212b through the opening C1, respectively, and the pad electrode 419 is connected to the upper layer 315 through the opening C4. Also, a part of the third conductive layer becomes the source/drain wiring 219c. The source/drain wiring 219c is electrically connected to the first electrode 312 and the third electrode 318 via the wiring portion 312a connected to the first electrode 312 and the opening C3. A first electrostatic capacitance of the first electrode 312 and the second electrode 314 and a second electrostatic capacitance of the second electrode 314 and the third electrode 318 are in parallel, thereby increasing a total electrostatic capacitance of the capacitor.

Figure 2F:
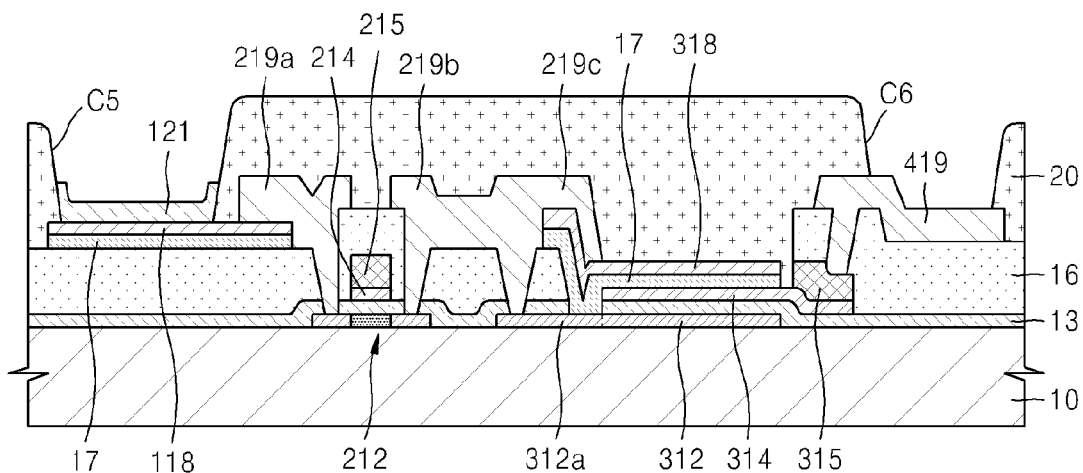

FIG. 2F is a cross-sectional view illustrating a sixth mask process of the method of manufacturing the organic light-emitting display device 1.

Referring to FIG. 2F, after the fourth insulating layer 20 is formed on a resultant structure of the fifth mask process of FIG. 2E, an opening C5 through which an upper portion of the pixel electrode 118 is exposed and an opening C6 through which a portion of the pad electrode 419 is exposed are formed.

The fourth insulating layer 20 can be an organic insulating film. In particular, if the fourth insulating layer 20 is a photosensitive organic insulating film, an additional photoresist is not required.

The opening C5 through which the upper portion of the pixel electrode 18 is exposed defines a light-emitting region, and increases an interval between the counter electrode 122 (see FIG. 1) and an edge of the pixel electrode 118, thereby preventing an electric field from concentrating on the edge of the pixel electrode 118 and a short circuit from occurring between the pixel electrode 118 and the counter electrode 122.

The organic light-emitting layer 121 can be formed on the pixel electrode 118 after the sixth mask process, and the counter electrode 122 (see FIG. 1), which is a common electrode, can be formed on the organic light-emitting layer 121, thereby completing the manufacture of the organic light-emitting display device 1 of FIG. 1. Also, an encapsulation member (not shown) can be further formed on the counter electrode 122.

Another embodiment of an organic light-emitting display device 2 is explained with reference to FIG. 3, by focusing on the differences from the organic light-emitting display device 1 of FIG. 1.

Figure 3:
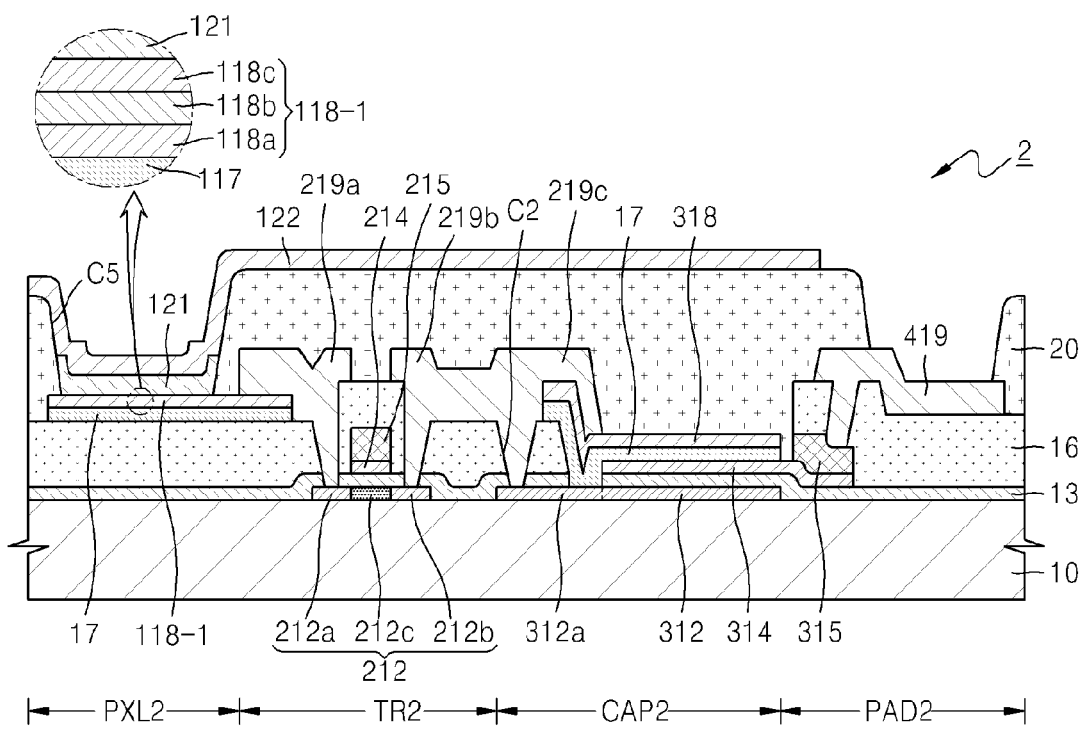
FIG. 3 is a cross-sectional view illustrating another embodiment of an organic light-emitting display device.

FIG. 3 is a cross-sectional view illustrating another embodiment of an organic light-emitting display device 2.

Referring to FIG. 3, the substrate 10 of the organic light-emitting display device 2 includes a pixel region PXL2, a transistor region TR2, a capacitor region CAP2, and a pad region PAD2. The transistor region TR2 and the pad region PAD2 are identical to the transistor region TR1 and the pad region PAD1 of the organic light-emitting display device 1 of FIG. 1.

In the pixel region PXL2, a pixel electrode 118-1 formed of the same material as that of the third electrode 318 of the capacitor is formed over the third insulating layer 17 disposed on the second insulating layer 16 disposed on the first insulating layer 13 disposed on the substrate 10. If the organic light-emitting display device 2 is a bottom emission organic light-emitting display device, the pixel electrode 118-1 can be a transparent electrode and the counter electrode 122 can be a reflective electrode.

The organic light-emitting layer 121 is formed on the pixel electrode 118-1, and light emitted by the organic light-emitting layer 121 is emitted toward the substrate 10 through the pixel electrode 118-1 formed of a transparent conductive material.

The pixel electrode 118-1 can include not only a transparent conductive layer 118a but also a semi-transmissive metal layer 118b disposed on the transparent conductive layer 118a.

Since the counter electrode 122 functions as a reflective mirror and the semi-transmissive metal layer 118b functions as a semi-transmissive mirror, light emitted by the organic light-emitting layer 121 resonates between the counter electrode 122 and the semi-transmissive metal layer 118b.

Accordingly, the light-use efficiency of the organic light-emitting display device 2 is further improved by a resonance effect due to a mirror as well as a resonance effect due to a DBR of the first insulating layer 13 through the third insulting layer 17 disposed under the pixel electrode 118-1.

The semi-transmissive metal layer 118b can be formed of at least one of silver (Ag), an Ag alloy, aluminum (Al), and an Al alloy. In some embodiments, in order to function as a resonant mirror with the counter electrode 122 which is a reflective mirror, the semi-transmissive metal layer 118b has a thickness equal to or less than about 300 Å.

If the semi-transmissive metal layer 118b includes silver (Ag), since the source electrode 219a and the drain electrode 219b are formed after the semi-transmissive metal layer 118b is formed, the semi-transmissive metal layer 118b including Ag can be damaged when the source electrode 219a and the drain electrode 219b are etched. Accordingly, a protective layer 118c for protecting Ag can be further disposed on the semi-transmissive metal layer 118b. The protective layer 118c can be formed of a transparent conductive oxide including ITO or the like.

The pixel electrode 118-1 including the semi-transmissive metal layer 118b is patterned in the fourth mask process. In this case, only the pixel electrode 118-1 is patterned when there is no additional layer disposed on the pixel electrode 118-1.

If another conductive layer (not shown) is further formed on the pixel electrode 118-1 and the conductive layer and the pixel electrode 118-1 are simultaneously patterned to have the same pattern, it is not easy to etch the pixel electrode 118-1. In particular, if the semi-transmissive metal layer 118b includes Ag, since the semi-transmissive metal layer 118b is easily damaged, it is difficult to form a resonant structure using a mirror. However, in FIG. 3, since only the pixel electrode 118-1 is patterned to function as a semi-transmissive mirror having a resonant structure, it is easy to form a resonant mirror.

Since the pixel electrode 118-1 and the third electrode 318 of the capacitor are formed of the same material, although not shown in FIG. 3, the third electrode 318 of the organic light-emitting display device 2 can include a transparent conductive layer, a semi-transmissive metal layer, and a protective layer which are sequentially stacked from the bottom, like the pixel electrode 118-1.

As described above, embodiments of an organic light-emitting display device and a method of manufacturing the same provide the following effects.

First, since capacitors are connected in parallel, an electrical capacitance can be increased.

Second, since it is easy to control a thickness of a capacitor with respect to a dielectric film and an electrical capacitance of the capacitor can be increased even with a small area, an aperture ratio can be increased.

Third, light-use efficiency can be improved by using a resonant structure using a semi-transmissive electrode of a pixel electrode and a resonant structure using an insulating layer under the pixel electrode.

Fourth, since a pad electrode is formed in a post-process, the reliability of the pad electrode can be prevented from being reduced.

Fifth, the organic light-emitting display device can be manufactured by using six mask processes.

While the present invention has been particularly shown and described with reference to certain embodiments thereof, it will be understood by those of ordinary skill in the art that various changes in form and details can be made therein without departing from the spirit and scope of the present invention as defined by the following claims.

What is claimed is:

1. An organic light-emitting display device comprising:
   a thin film transistor (TFT) comprising:
     an active layer,
     a gate electrode,
     a source electrode,
     a drain electrode,
     a first insulating layer disposed between the active layer and the gate electrode, and
     a second insulating layer disposed between the source electrode and the drain electrode;
   a pixel electrode disposed on the first insulating layer and the second insulating layer, and connected to one of the source electrode and the drain electrode;
   a capacitor comprising:
     a first electrode disposed on a same layer as the active layer,
     a second electrode disposed on the same layer as the gate electrode, and
     a third electrode formed of the same material as a material of the pixel electrode, wherein the second insulating layer is not disposed between the second electrode and the third electrode;
   a third insulating layer disposed between the second insulating layer and the pixel electrode, and further disposed between the second electrode and the third electrode;
   a fourth insulating layer covering the source electrode, the drain electrode, and the third electrode, and exposing a portion of the pixel electrode;
   an organic light-emitting layer disposed on the pixel electrode; and
   a counter electrode disposed on the organic light-emitting layer.

2. The organic light-emitting display device of claim 1, wherein the third insulating layer has a thickness less than a thickness of the second insulating layer.

3. The organic light-emitting display device of claim 2, wherein the thickness of the third insulating layer is from about 500 Å to about 2000 Å.

4. The organic light-emitting display device of claim 1, wherein the third insulating layer comprises at least one selected from the group consisting of SiNx, $SiO_2$, $ZrO_2$, TiO2, $Ta_2O_5$, and $Al_2O_3$.

5. The organic light-emitting display device of claim 1, wherein the first insulating layer, the second insulating layer, and the third insulating layer are sequentially disposed from between the substrate and the pixel electrode, and refractive indices of adjacent insulating layers of the first through third insulating layers are different from each other.

6. The organic light-emitting display device of claim 1, wherein each of the active layer and the first electrode comprises a semiconductor doped with ion impurities.

7. The organic light-emitting display device of claim 1, wherein the gate electrode comprises a first layer comprising a transparent conductive oxide and a second layer comprising a low-resistance metal, and wherein the second electrode comprises the transparent conductive oxide.

8. The organic light-emitting display device of claim 1, wherein the pixel electrode comprises a transparent conductive oxide.

9. The organic light-emitting display device of claim 8, wherein the transparent conductive oxide comprises at least one selected from the group consisting of indium zinc oxide (IZO), zinc oxide (ZnO), indium oxide ($In_2O_3$), indium gallium oxide (IGO), and aluminum zinc oxide (AZO).

10. The organic light-emitting display device of claim 8, wherein the pixel electrode further comprises a semi-transmissive metal layer.

11. The organic light-emitting display device of claim 10, wherein the semi-transmissive metal layer is disposed on a layer comprising the transparent conductive oxide.

12. The organic light-emitting display device of claim 10, wherein the semi-transmissive metal layer comprises at least one selected from the group consisting of silver (Ag), aluminum (Al), and an alloy thereof.

13. The organic light-emitting display device of claim 10, further comprising a protective layer disposed on the semi-transmissive metal layer.

14. The organic light-emitting display device of claim 13, wherein the protective layer comprises a transparent conductive oxide.

15. The organic light-emitting display device of claim 1, wherein the pixel electrode and the third insulating layer have a same etched surface.

16. The organic light-emitting display device of claim 1, wherein the third electrode and the third insulating layer have a same etched surface.

17. The organic light-emitting display device of claim 1, wherein one of the source electrode and the drain electrode connected to the pixel electrode is disposed over a portion of the pixel electrode.

18. The organic light-emitting display device of claim 1, further comprising a pad electrode formed of a same material as that of each of the source electrode and the drain electrode.

19. The organic light-emitting display device of claim 18, wherein the pad electrode is disposed on a same layer as each of the source electrode and the drain electrode.

20. The organic light-emitting display device of claim 1, wherein the counter electrode is a reflective electrode reflecting light emitted by the organic light-emitting layer.

21. An organic light-emitting display device comprising:
   a thin film transistor (TFT) comprising:
      an active layer,
      a gate electrode,
      a source electrode,
      a drain electrode,
      a first insulating layer disposed between the active layer and the gate electrode, and
      a second insulating layer disposed between the source electrode and the drain electrode;
   a pixel electrode disposed on the first insulating layer and the second insulating layer, and connected to one of the source electrode and the drain electrode;
   a capacitor comprising:
      a first electrode disposed on a same layer as the active layer,
      a second electrode disposed on the same layer as the gate electrode, and
      a third electrode formed of the same material as a material of the pixel electrode;
   a third insulating layer disposed between the second insulating layer and the pixel electrode, and further disposed between the second electrode and the third electrode;
   a fourth insulating layer covering the source electrode, the drain electrode, and the third electrode, and exposing a portion of the pixel electrode;
   an organic light-emitting layer disposed on the pixel electrode; and
   a counter electrode disposed on the organic light-emitting layer, wherein the counter electrode is a reflective electrode reflecting light emitted by the organic light-emitting layer.

* * * * *